United States Patent
Shaheen et al.

(10) Patent No.: US 7,052,978 B2
(45) Date of Patent: May 30, 2006

(54) ARRANGEMENTS INCORPORATING LASER-INDUCED CLEAVING

(75) Inventors: Mohamad A. Shaheen, Portland, OR (US); Mark Y. Liu, Portland, OR (US); Mitchell C. Taylor, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 110 days.

(21) Appl. No.: 10/649,958

(22) Filed: Aug. 28, 2003

(65) Prior Publication Data

US 2005/0048738 A1    Mar. 3, 2005

(51) Int. Cl.
*H01L 21/301* (2006.01)

(52) U.S. Cl. ............... 438/463; 438/458; 438/460

(58) Field of Classification Search ......... 438/460, 438/463, 458
See application file for complete search history.

(56) References Cited

U.S. PATENT DOCUMENTS

| | | | |
|---|---|---|---|
| 6,159,824 A | 12/2000 | Henley et al. | 438/455 |
| 6,159,825 A | 12/2000 | Henley et al. | 438/460 |
| 6,248,649 B1 | 6/2001 | Henley et al. | 438/515 |
| 6,290,804 B1 | 9/2001 | Henley et al. | 156/344 |
| 6,291,313 B1 | 9/2001 | Henley et al. | 438/458 |
| 6,291,314 B1 | 9/2001 | Henley et al. | 438/458 |
| 6,294,814 B1 | 9/2001 | Henley et al. | 257/347 |
| 6,309,950 B1 | 10/2001 | Forbes | 438/455 |
| 6,335,264 B1 | 1/2002 | Henley et al. | 438/460 |
| 6,335,559 B1 | 1/2002 | Charles | 257/620 |
| 6,391,740 B1 | 5/2002 | Cheung et al. | 438/455 |
| 6,455,342 B1 | 9/2002 | Kobayashi et al. | 438/33 |
| 6,458,672 B1 | 10/2002 | Henley et al. | 438/478 |
| 6,653,210 B1* | 11/2003 | Choo et al. | 438/460 |
| 6,740,604 B1* | 5/2004 | Kelly et al. | 438/795 |
| 2003/0153162 A1* | 8/2003 | Nakano et al. | 438/458 |
| 2003/0162367 A1* | 8/2003 | Roche | 438/460 |

OTHER PUBLICATIONS

Sze, Physics of Semiconductor Devices, (John Wiley & Sons, New York, 1981) pp. 850-851.*

People, Physics and Applications of $Ge_xSi_{1-x}$/Si Strained-Layer Heterostructures, *IEEE J. Quantum Electronics*, QE-22 (Sep. 1986) 1696.*

* cited by examiner

Primary Examiner—Christian D. Wilson
(74) Attorney, Agent, or Firm—Blakely, Sokoloff, Taylor & Zafman LLP

(57) ABSTRACT

Arrangements incorporating laser-induced cleaving.

38 Claims, 8 Drawing Sheets

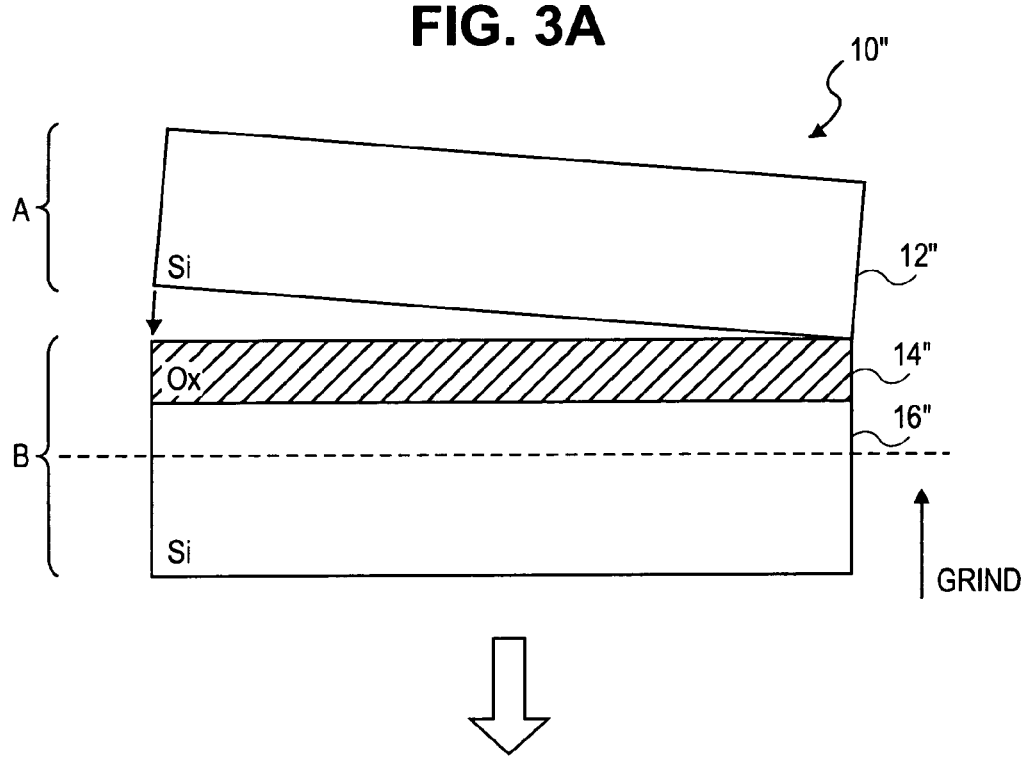
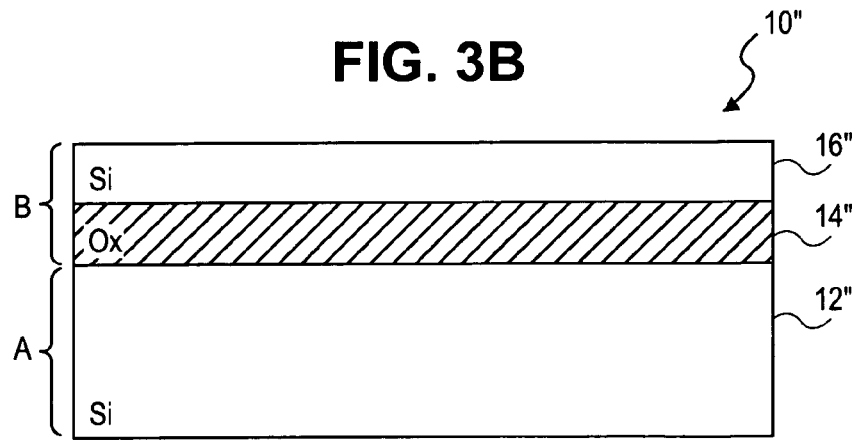

ARRANGEMENTS INCORPORATING LASER-INDUCED CLEAVING

FIELD

The present disclosure relates to arrangements incorporating laser-induced cleaving.

BACKGROUND

The semiconductor industry has a high present interest in silicon-on-insulator (SOI) technologies and in the cleaving of wafer layers from donor wafers for the purpose, for example, of layer transfer bonding of the cleaved layer to another (handle or carrier) wafer, and also has a high present interest in products utilizing cleaved and also SOI formed devices.

For example, SOI substrates have become desirable for many technologies, including metal-oxide semiconductor (MOS), complementary MOS (CMOS) devices, and advanced MOS junction-type field-effect transistors (MOSFETs). This is primarily because SOI fabrication processes may result in increased packing densities, improved performances (e.g., sped-up circuit operations), better device isolations and reduced extrinsic parasitic elements (particularly those of the source and drain as well as leakage currents).

What are needed are alternative and/or improved SOI technologies and/or cleave processes, and resultant improved SOI formed devices and products utilizing the same.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein:

FIGS. 3A and 3B illustrate an example background bond-and-etch-back SOI (BESOI) substrate manufacturing process of fabricating a SOI substrate useful in gaining a more thorough understanding/appreciation of the present invention;

DETAILED DESCRIPTION

Figure 1:
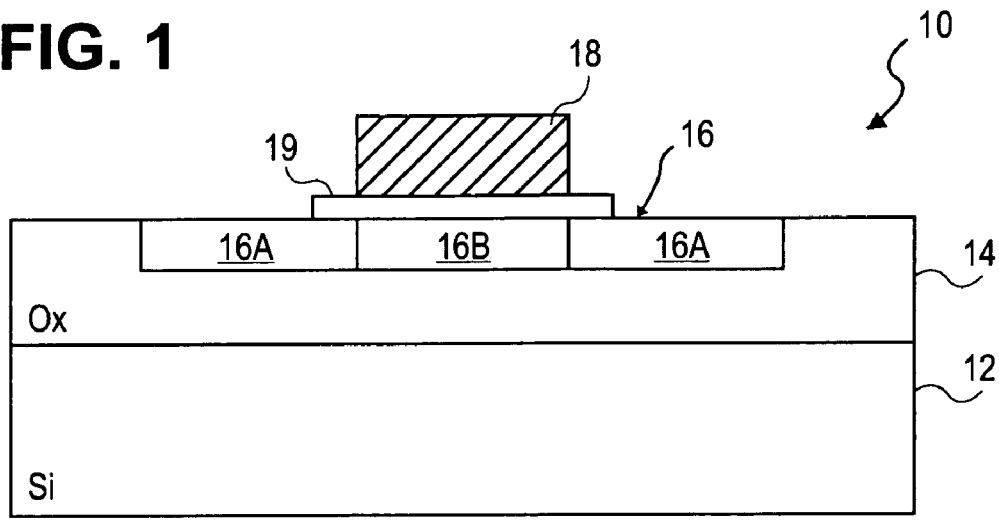
FIG. 1 illustrates a simplistic example background silicon-on-insulator (SOI) substrate useful in gaining a more thorough understanding/appreciation of the present invention.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. Well known power/ground connections to ICs and other components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits, flowcharts) are set forth in order to describe example embodiments of the invention, it should be apparent to one skilled in the art that the invention can be practiced without, or with variation of, these specific details.

Although example embodiments of the present invention will be described in the semiconductor art using example arrangements cleaving silicon and/or example arrangements of cleaved SOI devices and products incorporating the same, practice of the invention is not limited thereto. That is, the invention may be able to be practiced with other types of materials (e.g., germanium), and in other types of arts (e.g., crystal splitting and/or cleaving). As far as the semiconductor art is concerned, embodiments of the present invention may be applicable for use with all types of semiconductor substrates and silicon-on-insulator (SOI) devices, including, for example, MOS transistors, CMOS devices, dual-gate MOSFETs, as well as any new devices that may become viable as semiconductor technology develops further in the future.

As the name implies, SOI substrates generally include a thin layer of silicon on top of an insulator, and circuit components may be formed in and/or on the thin layer of silicon. FIG. 1 illustrates a simplistic generic SOI substrate 10 according to an example arrangement. Other arrangements are also possible. The SOI substrate 10 may include a semiconductor wafer 12, an insulator or dielectric layer 14 (such as $SiO_2$ and the like) formed on or attached to the main surface of the semiconductor substrate 12, and a silicon layer 16 (known as a SOI layer) having a desired thickness formed on and/or recessed into the dielectric layer 14. The semiconductor wafer 12 may be silicon, sapphire, or any appropriate material. A SOI device may be formed on and/or within the silicon layer 16, and may include, for example, source/drain regions 16A, a channel region 16B and a gate electrode 18 (provided on an insulator layer 19).

The SOI device may represent, for example, an NMOS transistor or a PMOS transistor in which the dopant impurity regions 16A may be heavily doped with a high concentration of either an n-type of impurity or p-type of impurity. That is, high concentration impurity ions may be implanted in the silicon layer 16 using a mask to form the dopant impurity regions (i.e., the source/drain regions 16A). In either case, the dielectric layer 14 may serve to reduce junction capacitance between the heavily-doped SOI device and the non-doped or lightly-doped silicon wafer 12. Such, in turn, may reduce power consumption and/or enable greater circuit speeds.

There are a number of disadvantageous techniques for the fabrication of SOI substrates, with a non-exhaustive listing including separation by implantation of oxygen (SIMOX), bonding-and-etch-back SOI (BESOI), hydrogen implantation and separation, selective epitaxial growth (SEG) and epitaxial lateral overgrowth (ELO). As it may lead to a better understanding/appreciation of embodiments of the present invention, a brief discussion of the construction/advantages/disadvantages of ones of these techniques is given as follows.

Figure 2:
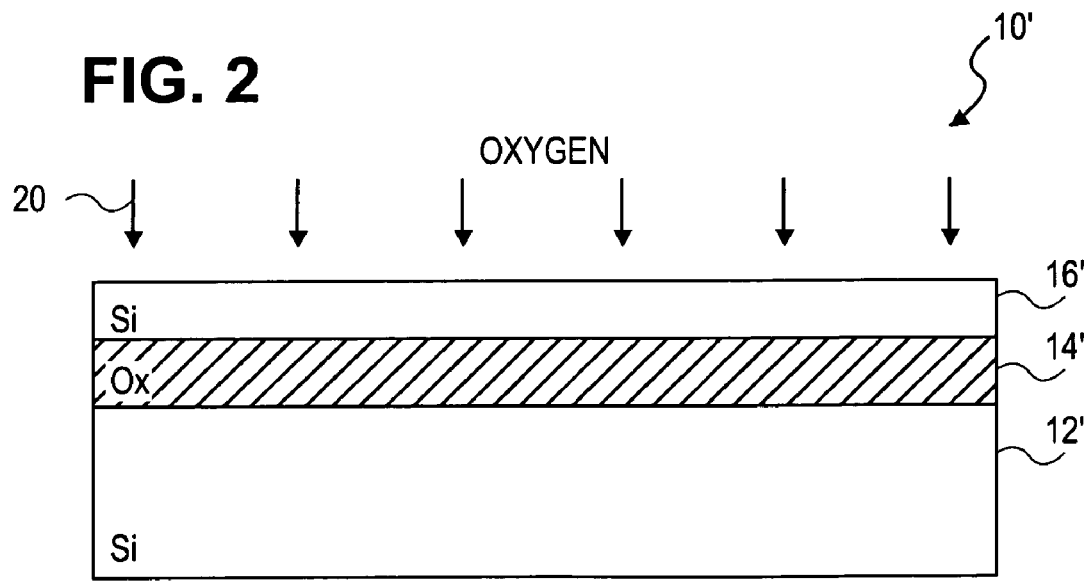
FIG. 2 illustrates an example background separation by implantation of oxygen (SIMOX) substrate manufacturing process of fabricating a SOI substrate useful in gaining a more thorough understanding/appreciation of the present invention.

FIG. 2 illustrates a separation by implantation of oxygen (SIMOX) substrate manufacturing process of fabricating a SOI substrate 10' according to an example arrangement. Other arrangements are also possible. As shown in FIG. 2, a high-dose of oxygen ions 20 may be implanted into the single-crystal silicon wafer 12', and a high temperature anneal processing may be used to cause a portion of the silicon atoms within the silicon wafer 12' and the implanted oxygen ions 20 to react so that a buried oxide layer 14' is formed with a silicon overlayer 16'. For example, for high-dose oxygen implantation, an implantation energy of 150–200 KeV, an ion dose of approximately $2 \times 10^{18}/cm^2$ and a substrate temperature greater than 600° C. may be used. The high dose oxygen implantation may then be followed by a high annealing temperature of greater than 1300° C. for at least 8 hours. For low dose oxygen implantation, a lower dose of oxygen of approximately $4 \times 10^{17}/cm^2$ and an annealing atmosphere of inert gas such as argon (Ar) and oxygen ($O_2$) may be used. The temperature and oxidation time period may be increased or decreased in proportion to the thickness of the buried oxide layer.

The SIMOX approach is advantageous in that cleaving and bonding processes are not required. Disadvantages are that implantation time can be intensive and cost prohibitive. Furthermore, the SOI substrate may (e.g., as a result of implantation impacts) be exposed to high surface damage and contamination.

FIGS. 3A and 3B illustrate a bond-and-etch-back SOI (BESOI) process of fabricating a SOI substrate according to an example arrangement. Other arrangements are also possible. As shown in FIG. 3A, two separate silicon substrates 10" (wafers) A and B may be used. The surface of the second silicon substrate B may be oxidized to form an oxide layer 14", e.g., by thermal oxidation or chemical vapor deposition (CVD). The oxidized silicon substrate B may then be diffusion-bonded to an unoxidized silicon 12" substrate A at the oxidized surface. The backside of the oxidized substrate B may then be grinded, polished, and/or etched to a thinned silicon layer 16' as shown (flipped over) in FIG. 3B.

The BESOI approach may be free from the implant damage inherent in the SIMOX approach. However, as disadvantages, the BESOI approach may be time consuming since a laborious sequence of grinding, polishing, and/or etching is required. In addition, substantial silicon may be wasted as a result of the grinding, polishing and/or etching. Still further, uniform thicknesses of both the silicon layer 16' and oxide layer 14' may be difficult to achieve.

Figure 4A:
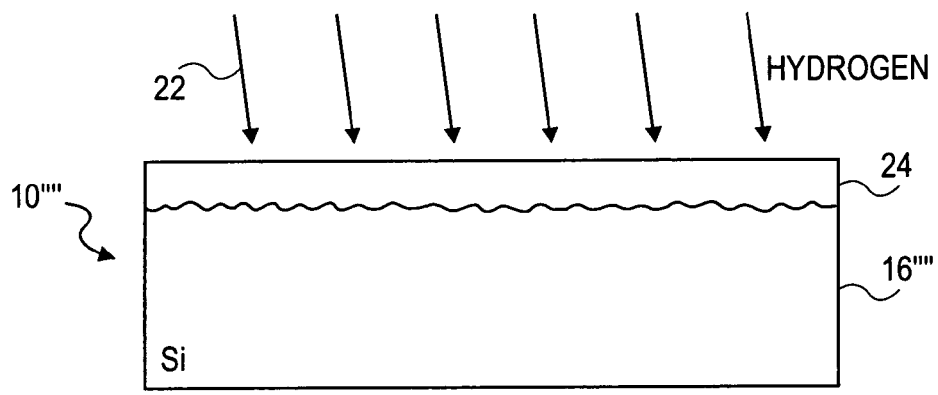
FIGS. 4A–4C illustrate a background hydrogen implantation and separation substrate manufacturing process of fabricating a SOI substrate useful in gaining a more thorough understanding/appreciation of the present invention.
Figure 4B:
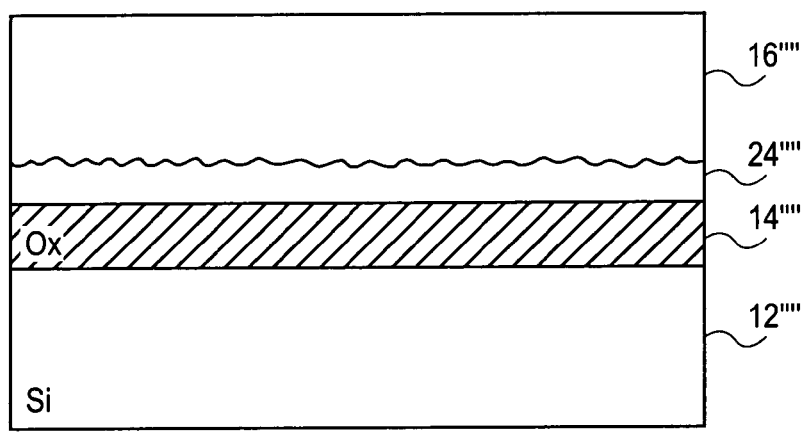
Figure 4C:
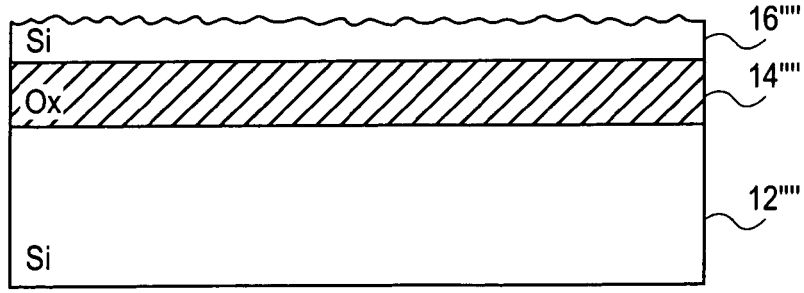

FIGS. 4A–4C illustrate a hydrogen implantation and separation process of fabricating a SOI substrate 10"" according to an example arrangement. Other arrangements are also possible. As shown in FIG. 4A, a heavy dose of hydrogen ions 22 may be implanted into the silicon wafer 16"" to form embrittlement region 24 in the silicon. The implanted wafer may then be bonded with another silicon wafer 12"" with an oxide layer 14"", as shown in FIG. 4B. The bonded wafer may be "cut" across the wafer at the peak location of the hydrogen implant by appropriate annealing, as shown in FIG. 4C, to form the silicon layer 16'.

As one disadvantage, since the uniform thickness of the silicon layer 16' of the SOI substrate 10' may still be difficult to obtain, this approach may not be suitable for fabricating fully-depleted SOI substrates.

Still another cleaving-type approach (not shown) defines a cleave plane using an interim deposited layer such as porous Si or SiGe upon which a subsequent device layer is then grown. For an Si bonded process, the porous Si is later recrystallized using a high temperature anneal process and an Epitaxial Si is grown over it. However, any defects in the recrystallization of the porous Si may disadvantageously propagate into the device layer. For SiGe, for example, there may be a lattice mismatch between Si and SiGe that may result in dislocations in the device Si layer, and such may be unacceptable for very thin device applications (such as fully depleted transistors). These dislocations may degrade the device performance and may result in yield-killing defects.

There is no current art for repairing post bond defects. One approach might be to pre-treat/pre-clean the bonded surface prior to the bonding process to minimize such defects. This may be done either using a wet clean (or a variation of it) with, for example, a 2 hr maximum delay between clean and bond. Another approach may combine the previous clean with an additional DI/mega-sonics clean immediately prior to bonding. A third approach may use an oxygen plasma clean prior to bonding.

The above cleaving approach may also result in unacceptable surface roughness. If so, a post-cleave surface smoothening process, such as CMP (chemical mechanical polishing), H (hydrogen) anneal and/or Ar (Argon) anneal, may be used to reduce the roughness, but these smoothening processes each have their own attendant problems. For example, the CMP process may deteriorate thickness uniformity and result in an edge bias. The H anneal process may be done, for example, at 1150 C for 1–2 hrs, but this is a safety concern due to the explosive nature of H at high temperatures. The Ar anneal adds complexity to the process and requires very high temperature processing (>1100 C anneal).

One approach to reduce the implanted dose needed to define the cleave plane is to combine different species specifically He with H to reduce this dose. Typically the dose is ~5E16 in Si, and could be reduced by 10–15% by using a He/H implant. As one example, atomic-level surface roughness may be obtained by using a combination of H implant and a SiGe cleave plane on which an epi layer is grown and using a N2 jet cleave method. However, this combination of H implant/SiGe growth may lead to a complex process. Further, the need to grow thin Si on SiGe may result in dislocations in the epi layer, which may be highly undesirable for device applications.

Another approach (not shown) is to use an alternate technology to implant the cleave layer, e.g., a plasma immersion ion implant. This approach may also involve application of thermal energy. That is, after implantation, cleave can be done by applying thermal energy with a >450 C anneal for >5 min, or by mechanical stress through a Nitrogen or water jet. The implanted layer forms microvoids in which pressure build-up is used to cause exfoliation, and thus a cleaving separation. For thin films, the film itself acts as a crack propagation guide if a cleave is initiated mechanically. This technology does not currently offer an advantage as far as effective dose reduction or productivity, and also this technology is still immature. Plus, a disadvantage is that a high thermal budget is required.

Another approach (not shown) may involve a mechanical separation process utilizing a mechanical cut (saw), an N2 jet, and/or a water jet incident on the side of the wafer. However, such approaches may be disadvantageous in that they are messy and can result in contaminants contaminating subsequent manufacturing processes.

In view of the above example approaches and their attendant problems, discussion now turns to example embodiments of the present invention, which utilize laser-induced substrate (e.g., wafers, die) cleaving and/or laser-effected cleaved substrates, and example uses of the same. Many differing embodiments are possible. A number of non-exhaustive/non-limiting embodiment examples will each be separately discussed as follows:

Laser Induced Atomic-Bond Cleaving:

One example embodiment (FIG. 5's cross-sectional view 500) involves application of a laser beam with a specifically tuned energy to induce selective atomic bond-breaking at an interface of a host material and an implanted species or thin film grown material. That is, such interface is used to define the cleave plane within a donor wafer 510.

An example process will now be described. First, a host/implanted interface region 520 may be formed (through any known process) within the donor wafer 510 below a silicon region 530. The donor wafer may then be bonded to another (handle or carrier) wafer (not shown in FIG. 5) which will provide a host for any cleaved (transferred) film (including silicon region 530). The wafers may then be loaded into a laser-equipped cleaving machine. Then tuned laser energy (shown representatively within FIG. 5 by the arrows 540) may be applied to the interface to effect cleaving.

Figure 6:
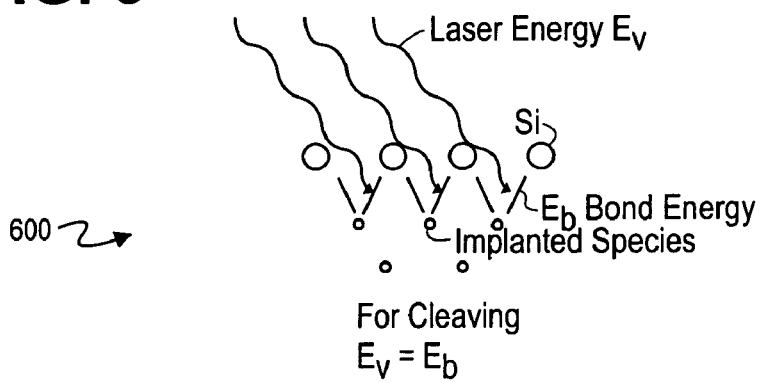
FIG. 6 shows a simplistic representation of a host/implanted interface with laser light energy acting upon ones of the host/implanted bonds, such representation being useful in gaining a more thorough understanding/appreciation of the present invention.

As more description to aid in understanding of the same, FIG. 6 shows a simplistic representation 600 of a small portion of the host/implanted interface, where silicon Si atoms and implanted species atoms are bonded together with bonds having bond energy $E_b$. Further shown in FIG. 6 are ones of laser light energy $E_v$ acting upon ones of the host/implanted bonds. When the laser energy $E_v$ acting upon a particular bond equals and exceeds the bond energy $E_b$, the bond between the host atom Si and implanted species atom may be broken. If sufficient laser energy is distributed across a sufficient area of the substrate, multiple host/implanted bonds may be broken so as to effect laser-induced cleaving of a layer. If the cleaved layer was previously bonded to a carrier substrate, the resultant laser-induced cleaving process thus results in the transfer of the cleaved layer from the donor substrate to the bonded (carrier) substrate.

As one refinement of such embodiment, a laser wavelength can be tuned or chosen so that the photon energy is made to substantially match the absorptive medium embedded in silicon substrate. Two non-limiting examples may be given as follows:

Example (1): For an example Si/Ge interface, a band gap of silicon is 1.11 eV, whereas a band gap of germanium is 0.66. The band gap of a silicon-germanium compound $Si(x)Ge(1-x)$ is generally=$1.11x+0.66(1-x)$. Accordingly, as one example, the photon energy of the impinged laser may be tuned to be greater than a band gap of SiGe, but smaller than that of silicon. Such may result in selective absorption and heating, and thus SiGe bond breaking and resultant selective cleaving.

Example (2): When hydrogen atoms can be implanted in silicon to accomplish the interface, Si—H bonds form. Si—H bonds have strong absorption peaks at an infrared wavelength range (~5 μm). Accordingly, to effect laser-induced cleaving, an infrared laser may be used, which will have selective absorption only for Si—H bonds. Such may result in selective absorption and heating, and thus Si—H bond breaking and resultant selective cleaving.

Turning now to further disclosure of the example embodiment, one non-limiting example process may be given as follows:

1. Implanting a species such as H, He or N or a noble gas into a donor substrate containing the desired film to be transferred. The implanted species is incorporated into the substrate and atomic-level bonds are formed between the implanted and host atoms to form an interface. This layer may be continuous or near continuous.

2. Next, there may be the bonding of the above (donor) substrate to another substrate that would act as the recipient or handle (i.e., receiving) substrate (e.g., wafer).

3. A laser is then made incident/scanned on the bonded substrates.

4. Selection of a specific energy is used to excite and selectively break the atomic bonds between the host and implanted species. This energy may be uniquely characteristic of the two types of materials.

5. A resultant laser-induced splitting causes selective cleaving along the atomic-interface plane.

6. Precise control of the laser incidence depth may be used for precise control of the transferred layer thickness.

7. Splitting and the prior bonding facilitates transfer of the desired layer to the host (handle) substrate.

On the transferred layer, a typical roughness may be in the 2–10 A range at a <2 um scale. However, surface roughness on the order of an atomic scale (5 A) may be obtainable. As one example, roughness may be able to be improved at the expense of larger within-wafer uniformity as a typical tradeoff.

The above process results in advantageous SOI products (e.g., SOI wafers, die, ICs) which incorporate advantageous laser-induced cleaves. Such cleaves may advantageously have the combination of low roughness <1 A with a <20 A total uniformity.

To summarize, the above-described embodiment enables the transfer of a layer from a donor wafer to a handle wafer with good control of transferred thickness, atomic-scale surface roughness and with low temperature processing. Example (but non-limiting) technical advantages of this example embodiment may listed as follows:

1. Improved surface roughness of a cleaved layer, which would enable <20 nm SOI due to stringent silicon variation requirements.

2. Improved uniformity of transferred layer due to lack of need for a polish process.

3. Improved control of device layer thickness produced by a bonded process for very thin applications (<20 nm), for example, as needed for fully depleted devices.

4. Reduced complexity of the process, and hence bonded wafer cost, through elimination, for example, of the thinning and smoothening processes.

Cleave Layer Stoichiometry Tuning for Laser Cleaving:

Another embodiment is similar to the above, but may utilize specific stoichiometry adjustment (e.g., designing) of an implanted or a thin film cleave layer so as to match its bond break energy to an incident laser energy for laser cleaving and layer transfer. The stoichiometry adjustment may be achieved by co-implant of a specific dose of a different species, such as Nitrogen in Si, or by adjusting composition of a thin film grown cleave layer, such as the Ge content in a SiGe film.

Some important example useable elements may be as follows:

1. Using either an implanted or a thin film grown cleave layer.

2. Using a co-implant, or co-deposition for the cleave layer.

3. Adjusting dose concentration of co-implanted, or co-deposited, material respectively, to select a specific stoichiometry.

4. Using a laser energy to induce bond breaking at the cleave layer interface of the host material.

5. Matching of the laser energy to the material bond break energy for selective cleaving.

6. Adjusting (e.g., designing through proper selection of materials, doses, etc.) the stoichiometry of implanted or grown cleave layer to achieve matching with laser energy and depth profile.

Turning now to further disclosure of this example embodiment, one non-limiting example process may be given as follows:

1) A specific material film with an absorption range matching the laser energy may be used as a cleave layer. Non-limiting examples include:
   a) Growth of a thin film (TF) with 2 or more components followed by growth of the desired to be transferred layer. Example, $Si_{0.6}Ge_{0.4}$ with absorption at 0.9 eV will correspond to a laser wavelength of xx um. The stoichiometry of the cleave layer can be adjusted to match the laser, for the prior example. If a shorter wavelength laser is used, a matched $Si_{0.5}Ge_{0.5}$ film would be needed to maintain laser absorption.
   b) Implantation of a specific species under the desired to be transferred layer. An example is using an implanted nitrogen gas for the cleave plane where the Silicon Nitride which can have a wide range of stoichimetries to match the laser energy. In this case, the stoichimetry is adjusted through dose selection.

2) In either case, a stoichiometry gradient is induced by adjusting a dopant profile (implant) or gas flow profile (TF dep) to induce a bond break threshold profile. This profile and its relationship to the laser energy is what defines the cleave plane and ensures controlled cleave on a sharp plane, providing a superior post cleave roughness.

3) The above wafer is cleaned and bonded to a handle wafer.

4) A laser beam of a specific energy is made incident upon the bonded wafers.

5) The laser energy is selected so that it matches the bond breaking threshold energy of the cleave layer, based on its stoichiometry composition profile, as explaned in 2 above.

6) The laser energy and cleave plane material composition are optimized to induce layer transfer with optimized (minimized) surface roughness.

Figure 5:
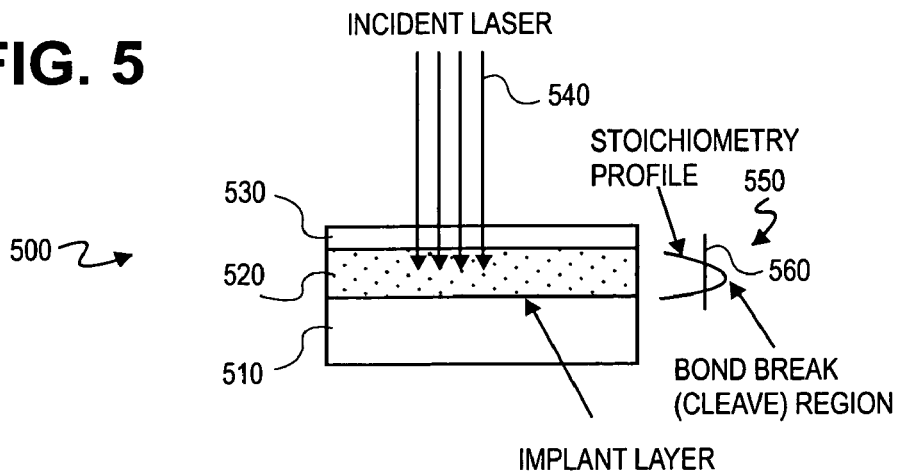
FIG. 5 illustrates a first cross-sectional view example utilizing a laser-induced cleaving embodiment of the present invention.

FIG. 5, in addition to being used to describe the prior embodiment, further shows a simplistic representation 550 of a stoichiomertry profile, with an example bond-break threshold 560 shown representatively as a vertical axis. Any laser energy to the left of such threshold 560 results in negligible bond breakage, whereas any laser energy at or to the right of such threshold 560 may result in bond breakage.

Figure 7:
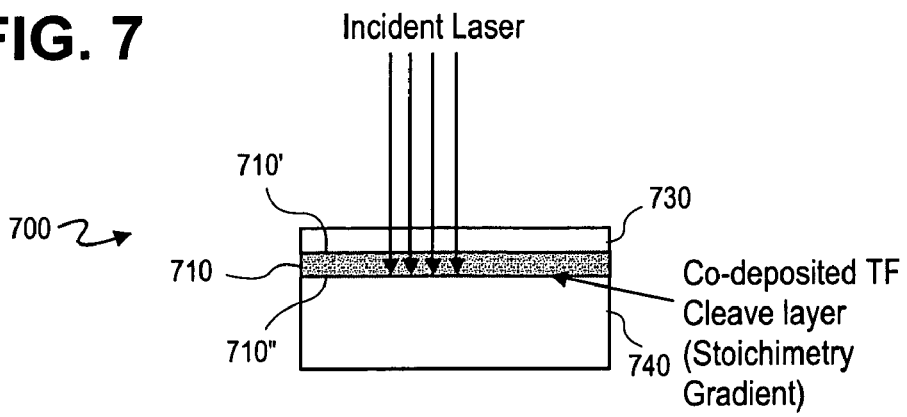
FIG. 7 illustrates another cross-sectional view example utilizing a stoichiometry laser-induced cleaving embodiment of the present invention.

Whereas FIG. 5 may be representative of an embodiment having a wider host/implanted interface region 520, FIG. 7's cross-sectional view 700 may be representative of a thin film (TF) stoichiometry cleave embodiment having TF stoichimetry layer 710. The FIG. 7 TF embodiment may be advantageous over the FIG. 5 embodiment, in that a stoichiometry interface may be able to be more precisely defined. For example, such stoichiometry interface may be more exactly defined at one 710' or the other 710" of the borders abutting against the silicon region 730 and main body 740 of the substrate, respectively.

This process may result in advantageous SOI products (e.g., SOI wafers, die, ICs) which differ somewhat from other SOI products. That is, after the cleaving process of other types of SOI products, the remaining layer may be surface treated to remove any prior process contamination or residues, reduce the thickness and improve surface roughness. Such surface treatment may significantly alter the surface of the film and a remaining material signature of the laser-assisted layer transfer (LALT) process may not be detectable at the surface. In contrast, if a stoichiometry adjustment is used through co-implant or co-deposition according to the present embodiment, the new species may not need further treatment and thus may leave behind a trace of the material in the transferred layer, and such material may be detectable using a technique such as secondary ion mass spectrometer (SIMS), especially compared to a single species implant, or thin deposited film (TDF) cleave layer process.

Analysis and/or experimental results have shown that a successful yield of the stoichiometry approach may depend a balancing of stoichiometry composition and a degree of laser energy. More particularly, attention is directed to FIG. 8 graph which illustrates generalities of such results. A horizontal axis represents stoichiometry, whereas a vertical axis represents laser energy. As can be seen by the graph, a first situation (lower left-hand graph region) of insufficient stoichiometry and insufficient laser energy generally results in no cleave. In direct contrast (upper right-hand graph region), an excessive stoichiometry and laser energy generally results in low productivity. Continuing on, insufficient stoichiometry paired with excessive laser energy (upper left-hand graph region) generally results in uncontrolled splitting. Finally, excessive stoichiometry paired with insufficient laser energy (lower right-hand graph region) generally results in no cleave.

Figure 8:
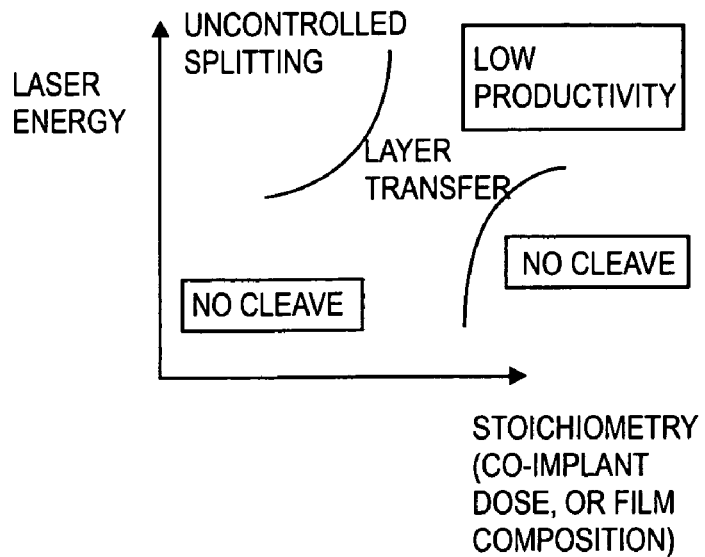
FIG. 8 is a graph of analysis and/or experimental results showing that a successful yield of a stoichiometry approach may be related to a balancing of stoichiometry composition and laser energy.

The central graph regions of the FIG. 8 graph represent advantageous situations, i.e., where a balancing of stoichiometry verses laser energy successfully effect layer transfer. Successful balancing and/or even ideal balance for any particular implementation highly depends upon many factors (e.g., materials and laser used), and determination of the same for a particular arrangement should be well within the purview of one skilled in the art.

As advantages, the present embodiment may address the problems of:

1. The complexity and low productivity associated with definition of a cleave plane using a high dose implants or thin film deposition for the layer transfer (bond and cleave). For example:
   a) the use of an implant process adds complexity and induces damage in the substrate that may require post annealing.
   b) the use of high dose implants results in low productivity, and subsequently, higher costs of the bonded process, as well as crystal damage.
   c) the use of the thin film process adds complexity and induces crystal defects due to lattice mismatch, layer strain or transferred defects.

2. High surface roughness of transferred layer post cleaving. This may result, for example, from a spatial and energy spread of a disadvantageous cleave processes that insufficiently guides the cleave process resulting in large surface roughness and/or non-uniformity of the cleaved layer. The consequence of this resulting surface roughness is the need for further processing to smoothen the cleaved surface adding complexity and cost.

Some non-exhaustive and non-limiting technical advantages of this example embodiment may be listed as follows:

1. Reduces an implant dose needed for cleaving. This may improve the productivity of the implant process, reduce the bonded process cost, and reduce the damage to the device layer due to implantation.

2. Improves surface roughness of cleaved layer which would thus enable <20 nm SOI due to stringent Silicon variation requirements.

Figure 9:
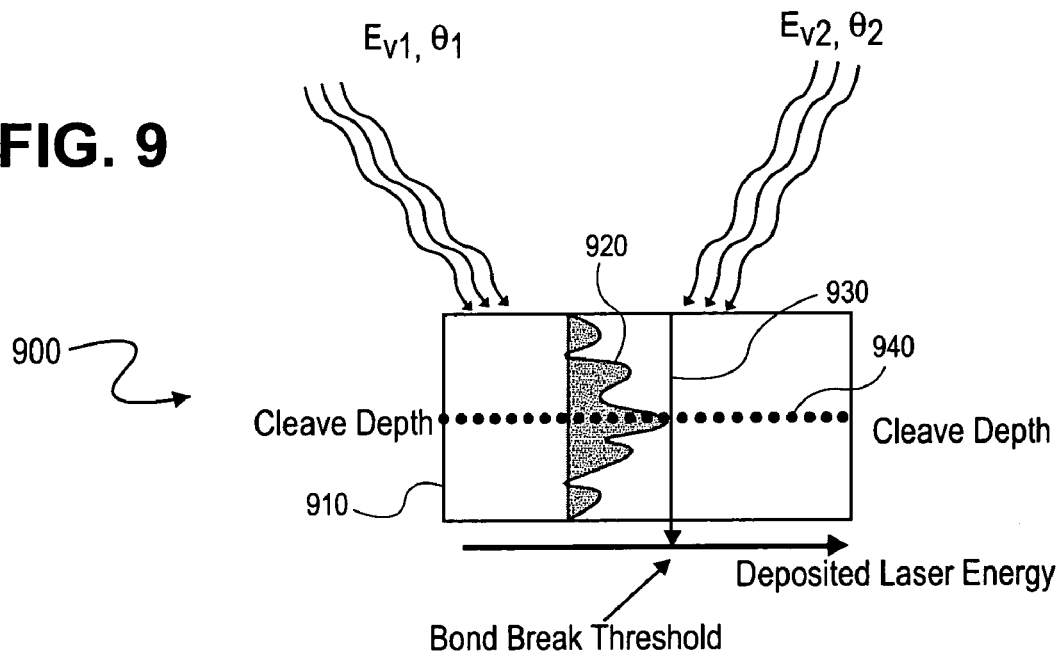
FIGS. 9–11 illustrate are further cross-sectional view examples of embodiments utilizing simultaneous application of a plurality (e.g., two) of interfering laser beams with a specifically tuned energy and space profile, as further embodiments of the present invention.

Laser Guided Cleaving for Layer Transfer Applications:

A next embodiment (FIGS. 9–11) involves simultaneous application of a plurality (e.g., two) laser beams with a specifically tuned energy and space profile to induce selective bond-breaking and wafer splitting along a specific laser-defined cleave plane. Laser beam interference may be used to selectively deposit laser energy at a certain depth below the silicon surface. Adjusting (i.e., designing of) the profile of the laser energy interference pattern relative to the threshold bond-breaking energy may result in selectivity of a desired cleave plane (e.g., depth), and transfer (if desired) of the cleaved layer to an underlying bonded substrate.

This embodiment may be called a laser guided cleaving (LGC) embodiment in that interfering lasers (rather than implants or interface layers) define/effect the cleave layer (i.e., plane). That is, other layer transfer processes rely on some form of implant or thin film to define a cleave layer, where as the present embodiment does not.

Some important example elements of this LGC embodiment may be as follows (see FIG. 9's cross-sectional view 500):

1. Utilizing multiple incident lasers with a range of energies $E_{v1}$, $E_{v2}$ and incidence angles $\theta_1$, $\theta_2$, and applying the same to a substrate 910.

2. Creating an interference-based space profile (shown representatively by profile 920 overlaid on the substrate 910) for laser energy deposition. Within the FIG. 9 example profile, deposited laser energy increases from left-to-right within the profile 920.

3. The energy deposition profile values relative to the bond breaking threshold may result in depth selection of the cleave plane. That is, FIG. 9 also illustrates an example bond-break threshold 930 shown representatively as a vertical axis. Any laser energy insufficiently to the left of such threshold 930 results in negligible bond breakage, whereas any laser energy at or exceeding to the right of such threshold 930 may result in bond breakage.

4. This enables a layer transfer process that does not require a film deposition or implant step for pre-defining a cleave plane, i.e., an implant-less layer transfer.

5. Tuning of the laser energy and incidence angle to match energy needed for selective bond breaking of the cleave layer. Note from FIG. 9 that laser energy at or exceeding to the right of the threshold 930 may be used precisely to define the cleave plane 940 at a precise cleave depth.

6. Use of the above ideas may be used to produce SOI and ultra thin SOI layers with superior smoothness.

7. Use of above ideas may be used to perform layer transfer on Si to non-Si substrates.

As one refinement of such embodiment, a laser wavelength can be tuned or chosen so that the photon energy is made to substantially match an absorptive medium embedded in silicon substrate. Two non-exhaustive and non-limiting examples may be given as follows:

Example (1): For an example Si/Ge embedded medium, a band gap of silicon is 1.11 eV, whereas a band gap of germanium is 0.66. The band gap of a silicon-germanium compound $Si(x)Ge(1-x)$ is generally $=1.11x+0.66(1-x)$. Accordingly, as one example, the photon energy of the impinged laser may be tuned to be greater than a band gap of SiGe, but smaller than that of silicon. Such may result in selective absorption and heating, SiGe bond breaking and resultant selective cleaving.

Example (2): When hydrogen atoms can be implanted in silicon as the embedded medium, Si—H bonds form. Si—H bonds have strong absorption peaks at an infrared wavelength range (~5 μm). Accordingly, to effect laser-induced cleaving, an infrared laser may be used, which will have selective absorption only for Si—H bonds. Such may result in selective absorption and heating, Si—H bond breaking and resultant selective cleaving.

Figure 10:
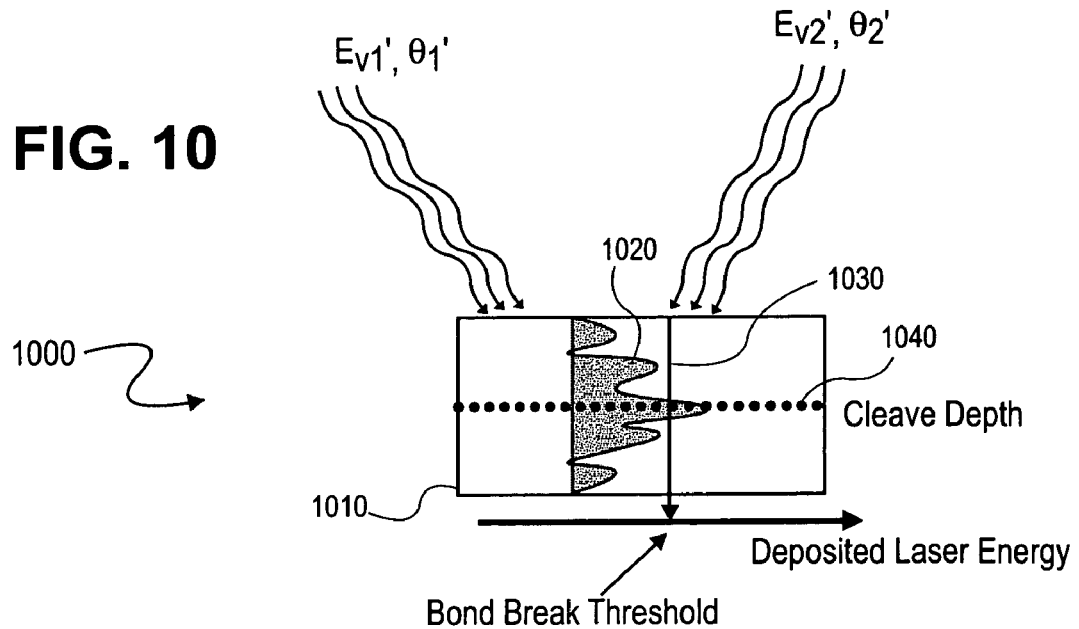
Figure 11:
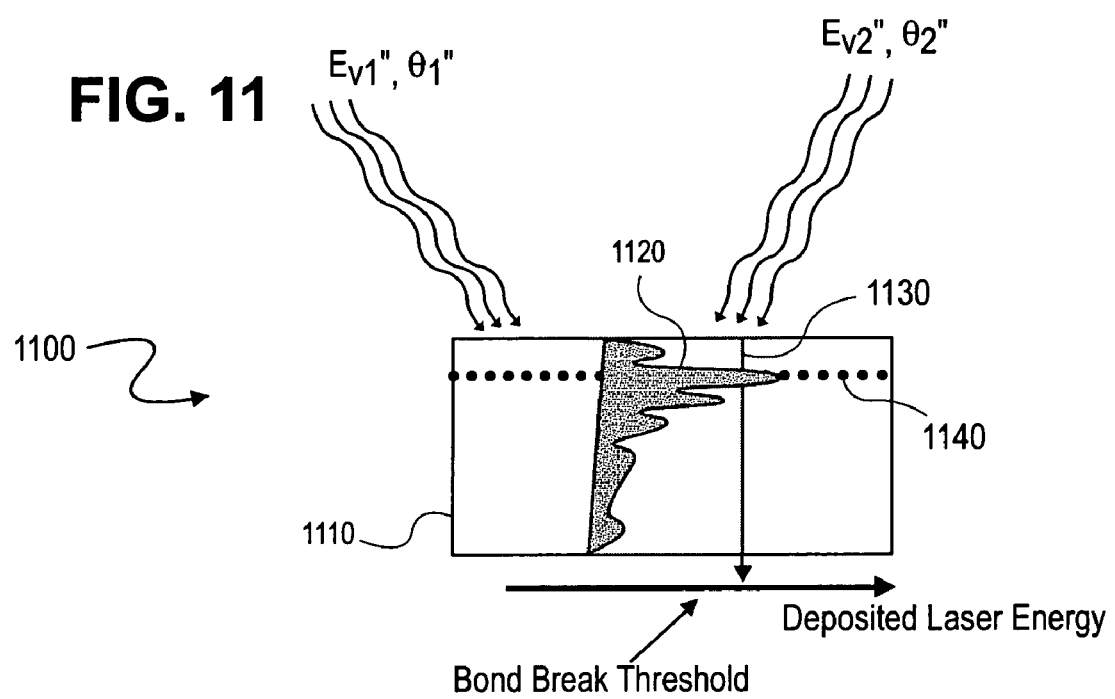

FIGS. 10–11 illustrate two specific examples where laser energy at or exceeding to the right of the threshold may be used precisely to define a cleave plane at differing precise cleave depths. More particularly, in first looking at FIG. 10 example 1000, multiple incident lasers with energies $E_{v1}'$, $E_{v2}'$ and angles $\theta_1'$, $\theta_2'$ applied to a substrate 1010, result in an interference-based space profile 1020 having laser energy at or exceeding to the right of a threshold 1030, so as to precisely define a cleave plane at a predetermined cleave depth 1040. In contrast, FIG. 11's example 1100 with multiple incident lasers with energies $E_{v1}''$, $E_{v2}''$ and angles $\theta_1''$, $\theta_2''$ applied to a substrate 1110, result in an interference-based space profile 1120 having laser energy at or exceeding to the right of a threshold 1130, so as to precisely define a cleave plane at a lesser predetermined cleave depth 1140.

Careful selection of the energies, angles, space profile and threshold may be used to define/effect a cleave plane at any desired cleave depth.

The above process may result in advantageous SOI products (e.g., SOI wafers, die, ICs) which differ somewhat from the other SOI products. That is, other cleave processes leave very low traces of species that could be detected in the transferred film. For example, in H-implant cleave layers, residuals of H of the order of ppb may remain in the transferred film. As another example, for a SiGe-defined cleave plane, some Ge may remain in the film. For the case of implant-less or film-less LGC as in the present embodiment, the absence of any traces may indicate that this embodiment of the present invention was used. In another application where porous Si defines the cleave plane, the recrystallized porous Si leaves behind a signature in defects in the layer due to incomplete recrystallization. The lack of presence of the defects in this case may be an indication of use of LGC.

As advantages, the present embodiment may address the problems of:

1. The complexity and low productivity associated with definition of a cleave plane using high dose implants or thin film deposition for the layer transfer (i.e., bond and cleave). That is:
   a) the use of high dose implants in other approaches results in low productivity, and subsequently high cost of the bonded process as well as crystal damage. The typical needed dose is 5E16 cm-2 of a species as H+. In addition to low run rate (13 wfr/hr), implanters disadvantageously occupy a large foot print of fab space. In addition, implanters introduce damage and surface particles that require an additional clean. Typical implant ranges of several thousand Angstroms are not compatible with ultra thin SOI and require either a thick oxide that is thinned post implant or a polish step to remove Si. Same arguments hold for non-Si materials.
   b) the use of the thin film process in other approaches adds complexity and induces crystal defects due to lattice mismatch, layer strain or transferred defects.

2. High surface roughness of transferred layer post cleaving. This disadvantage of other approaches results from the spatial and energy spread of typical cleave processes that insufficiently guides the cleave process resulting in large surface roughness and non-uniformity of the cleaved layer. The consequence of this resulting surface roughness is the need for further processing to smoothen the cleaved surface, thus adding complexity and cost.

3. Large variation in layer thickness of other approaches due to a spatially wide cleave plane. This can be of critical importance for applications requiring very thin and tight control of a device layer, such as fully depleted transistors. If the variation is outside the process window of such transistors, this would result in both performance variation and functionality loss of the devices. Both would have impact as far as yield and cost of any die produced.

Some non-exhaustive and non-limiting technical advantages of this example embodiment may be listed as follows:

1. Eliminates the need for implantation in cleaving. This may improve the productivity of layer transfer process significantly and reduce the cost of bonded wafers, such as SOI, by more than 30%. It also may reduce the damage to the device layer.

2. Improves surface roughness of cleaved layer which would enable <20 nm SOI due to stringent silicon variation requirements.

3. Improves control of a device layer produced by the bonded process for very thin applications (<20 nm) as needed for fully depleted devices.

Figure 12:
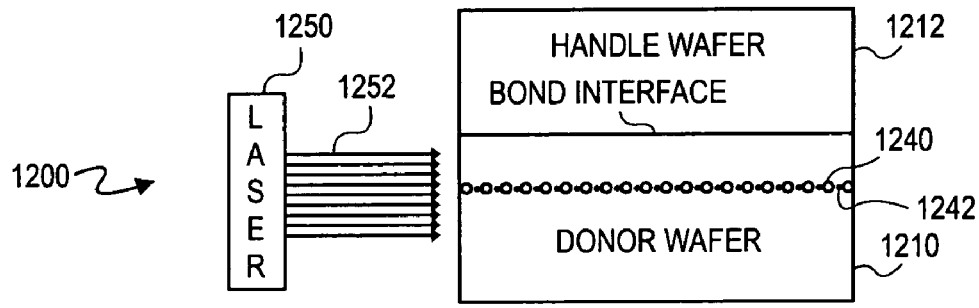
FIG. 12 illustrates yet another cross-sectional view example utilizing a laser-induced side-cut and/or microvoid cleaving embodiment of the present invention.

Laser Cut for Layer Transfer Applications:

A next embodiment (FIG. 12) involves an arrangement 1200 using application of laser beams 1252 with a specifically tuned energy in a side-cut mode to initiate cleave of a pre-annealed bonded substrate 1210 (e.g., wafer or die) to induce splitting along a cleave plane 1242. The process may be used, for example, to transfer the cleaved layer to a bonded carrier substrate 1212 (e.g., wafer or die). Although an insulator or dielectric layer may again formed on or attached to the main surface of the carrier substrate prior to carrier/donor substrate bonding, such layer is not shown within FIG. 12 (or FIG. 13) for sake of brevity/simplicity.

Some important example elements may be as follows:

1. Pre annealing of an implanted and bonded wafer pair to induce micro voiding (1240) but not exfoliation.

2. Using a laser beam (1250) to impart laser beams 1252 incident at a side interface of a bonded substrate pair having a pre-defined cleave plane, so as to induce separation at that plane to transfer the cleaved layer from one (donor) substrate to the other (carrier) substrate.

One example process to implement this embodiment may be as follows:

1. A donor wafer 1210 having a desired layer to be transferred is implanted using H, $H_2$, He or other inert/noble gases or combination of gases.

2. The donor wafer 1210 is bonded to a handle wafer 1212 after the pair is cleaned using any known process.

3. The pair is annealed in the range of 250° C.–450° C. for 10–30 min

4. A laser beam 1252 is caused to be incident at the side interface of two bonded films.

5. The bonded pair (e.g., wafers) may be rotated during the laser side-cut step, e.g., to more equally apply/distribute the laser energy around an entire periphery of the substrates.

6. The energy of the laser is absorbed in the cleave layer near the wafer edge. The gases coalesce into microvoids 1240 which may induce local cracking and eventual propagation along cleave plane 1242, which may eventually cause substrate 1210 splitting and layer transfer to the carrier substrate 1212.

Without the present embodiment, two disadvantageous side-cut approaches may be used for a layer transfer process as follows. In a first approach, a donor wafer receives an implant of H or other inert/noble gases or combination of gases to define a cleave layer. The donor wafer is bonded to another wafer, handle, and the pair is annealed at 300–600 C. The gases coalesce into voids thus to induce blistering and separation of the two wafers, with a layer above the implant being transferred from the donor to handle wafer. In another approach, the wafers are mechanically separated by water jet or nitrogen cleave after or without a low temp 100–300 C anneal.

In the second approach, a thin film is grown on one wafer to act as a cleave or separation layer. The desired layer is either grown on the thin film or another wafer and the wafers are then bonded. A thermal anneal, or mechanical (e.g., water jet or nitrogen) process, similar to the described above is then applied to induce the wafer separation and layer transfer.

In contrast, the present embodiment of the present invention utilizes laser energy to induce the wafer separation and layer transfer.

As advantages, the present embodiment may address the problems of:

1) Use of high temperature (>450 C) to induce layer separation.

2) Use of mechanical pre-separation, and hence metal contamination, at low temperature processes.

Some non-exhaustive and non-limiting technical advantages of this example embodiment may be listed as follows:

1. Reduces the thermal budget needed for the layer transfer process.

2. Improves surface roughness post cleaving, so as to significantly reduce or even eliminate a need for a post-cleave surface smoothening process, such as CMP (chemical mechanical polishing), H (hydrogen) anneal and/or Ar (Argon) anneal.

3. Reduces mechanical damage from room temperature separation.

Figure 13:
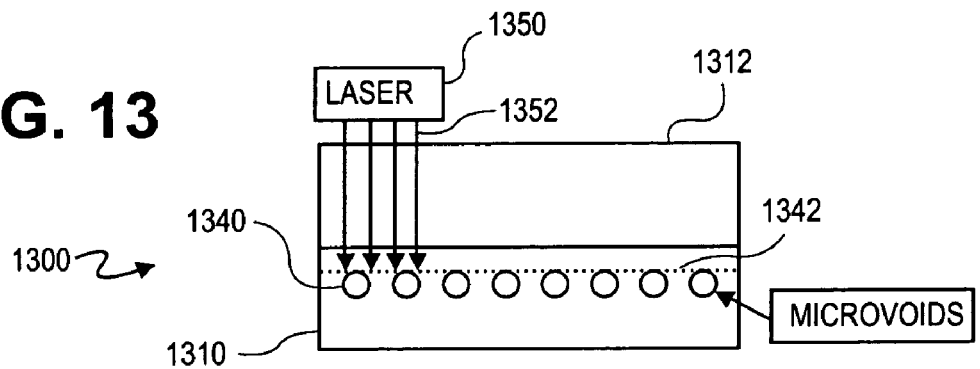
FIG. 13 illustrates a further cross-sectional view example utilizing a laser-induced top-cut and/or microvoid cleaving embodiment of the present invention.

FIG. 13 is another microvoid embodiment 1300, where laser energy is alternatively applied to the from a direction of a major planar surface of the substrates (as opposed to from the sides). More particularly, laser 1350 applies laser beams 1352 from, for example, a carrier substrate 1312 side, so that energy of the laser is absorbed, and microvoids 1340 are formed in a cleave layer 1340 near the wafer edge. As a result, a cumulative effect of the microvoids 1340 may induce local cracking and eventual propagation, which will cause splitting of the substrate 1310 along the cleave plane 1342 and an orphaning of a resultant layer transfer from the donor substrate 1310 to the carrier substrate 1312. The same advantages as the FIG. 12 embodiment may be obtained.

The FIGS. 5–13 embodiments which result in improved surface roughness post cleaving so as to significantly reduce or even eliminate a need for a post-cleave surface smoothening process, may result in reduced SOI and bulk substrate reusage handling. To explain, FIG. 14's embodiment 1400 will be used.

Figure 14:
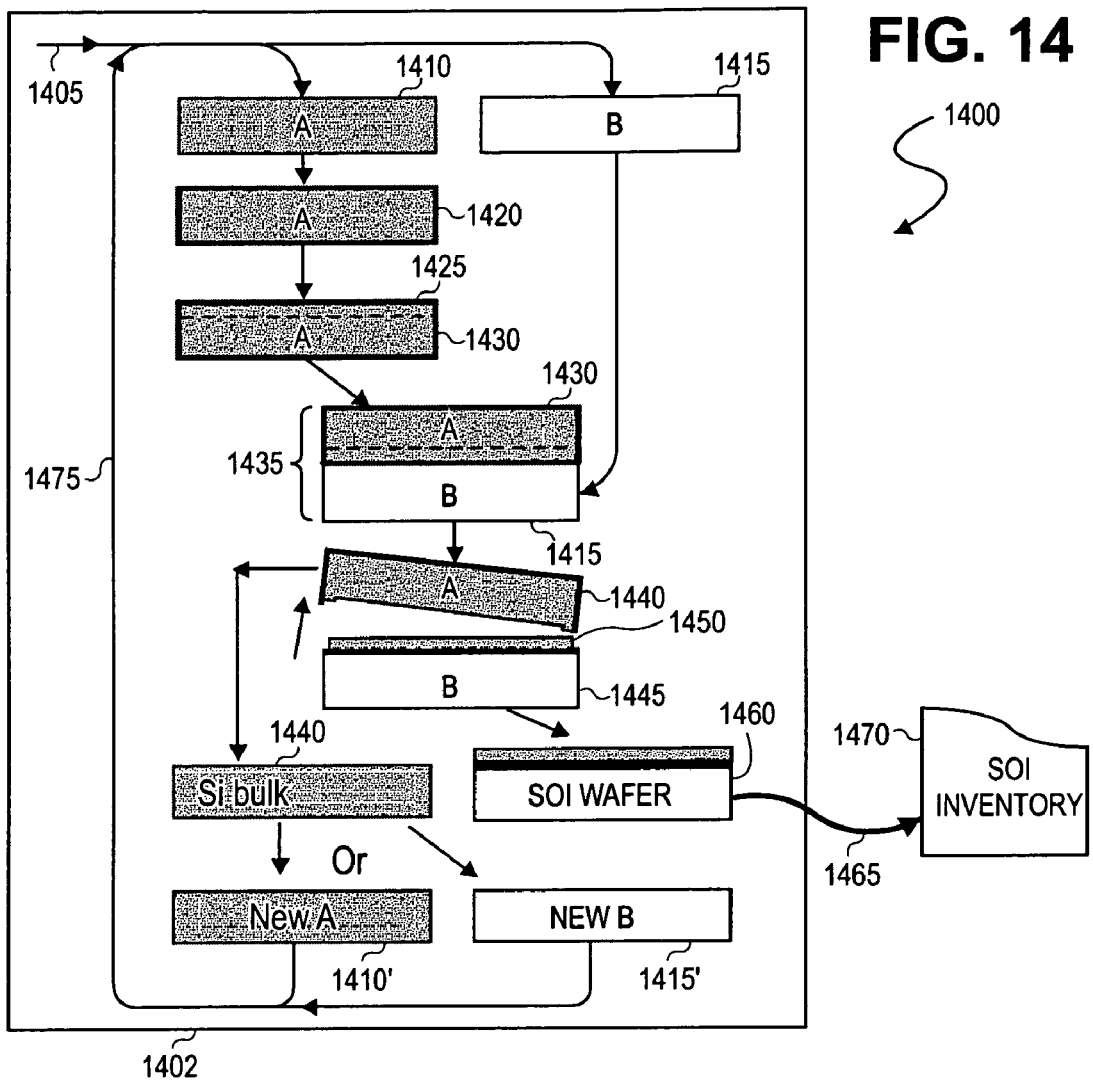
FIG. 14 shows a manufacturing flow useable with implementations of the present invention, such flow being useful in gaining a more thorough understanding/appreciation of the present invention.

More particularly, FIG. 14 shows a manufacturing flow 1402. In the beginning, bulk substrates are supplied 1405 from an external source. A first (donor) substrate 1410 is treated in any known manner so as to form an insulator or dielectric layer 1420 (such as $SiO_2$ and the like) on or attached to the main surface of the semiconductor substrate 1410. While FIG. 14 shows the insulator or dielectric layer 1420 on all external surfaces of the substrate 1410, forming the layer 1420 only on one major planar surface of the substrate 1410 may be more advantageous as will become more apparent in continued description ahead.

In addition to the layer 1420, a cleave plane is defined in a desired manner within the donor substrate 1410. The donor substrate 1430 is then bonded in a desired manner to a second (carrier or handle) substrate 1415, so as to form a bonded substrate pair 1435. Laser induced cleaving according to the present invention is effected so as to cleave the donor substrate 1430, and result in formation of a bulk substrate 1440 and an SOI substrate 1445 (e.g., wafer). Again, an SOI result (assuming the donor substrate is made of silicon) is a silicon layer 1450 integral with substrate 1445 with intermediary insulator or dielectric layer 1455. separate the bonded.

Since use of laser induced cleaving according to the present invention may result in improved surface roughness post cleaving, the SOI substrate 1445 may be able to become 1465 part of an SOI inventory 1470, with application of little or no post-cleave surface smoothening process such as CMP, H-anneal and/or Ar-anneal. Such is an advantageous reduced SOI handling.

Further, since the bulk substrate 1440 likewise has improved surface roughness post cleaving, the bulk substrate 1440 may be able to be ready for immediate reuse 1475 as a donor substrate 1410' or carrier substrate 1415', again with application of little or no post-cleave surface smoothening process such as CMP, H-anneal and/or Ar-anneal. This is especially true if the insulator or dielectric layer is formed only on one major planar surface of the donor substrate as was previously discussed, in that substantially all of such layer may be transferred to the SOI substrate 1445, and the bulk substrate 1440 would not require any special treatment to consider or remove remaining insulator or dielectric layers or material thereon. All of the above may result in advantageous reduced bulk substrate reusage handling.

Figure 15:
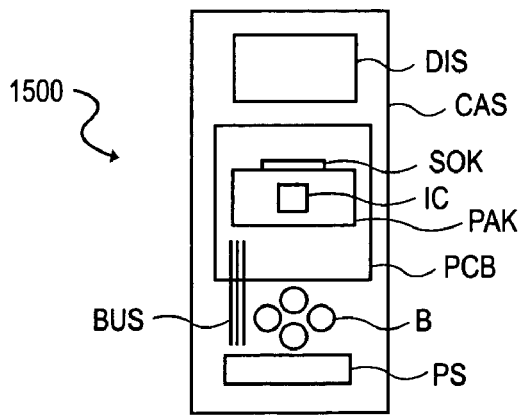
FIG. 15 illustrates example electronic system arrangements that may incorporate laser-induced cleaving arrangements of the present invention.

FIG. 15 illustrates example electronic system arrangements 1500 that may incorporate laser-induced cleaving arrangements of the present invention. More particularly, shown is an integrated circuit (IC) chip that may incorporate one or more SOI implementations of the present invention within an IC chip system. Such IC may be part of an electronic package PAK incorporating the IC together with supportive components onto a substrate such as a printed circuit board (PCB) as a packaged system. The packaged system may be mounted, for example, via a socket SOK onto a system board (e.g., a motherboard system (MB)) which may have other SOI IC implementations of the present invention. The system board may be part of an overall electronic device (e.g., computer, electronic consumer device, server, communication equipment) system that may also include one or more of the following items: input ports (e.g., user buttons) B, output ports (e.g., display DIS), a bus or bus portion BUS, a power supply arrangement PS, and a case CAS (e.g., plastic or metal chassis).

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment or component, it is submitted that it is within the purview of one skilled in the art to effect such feature, structure, or characteristic in connection with other ones of the embodiments and/or components. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc. Finally, method embodiments may be emulated as apparatus embodiments (e.g., as a physical apparatus constructed in a manner effecting the method); apparatus embodiments may be emulated as method embodiments.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A method comprising:
   forming a cleave layer in a substrate, wherein the cleave layer comprises silicon-germanium (SiGe), and the substrate comprises silicon;
   impinging laser energy on the substrate; and
   effecting laser-induced cleaving along the cleave layer by performing at least one of:
   stoichiometrically adjusting a Ge content in a SiGe material to form the cleave layer in the substrate to match a bond breaking energy involving the SiGe material to a laser energy characterized by a laser wavelength; and
   selecting the laser wavelength to provide the laser energy to substantially match a bond-breaking threshold energy of the material, based upon at least a stoichiometric composition of the SiGe material of the cleave layer, wherein the laser wavelength is tuned to provide the laser energy to be greater than a band gap of SiGe and smaller than that of Si.

2. A method as claimed in claim 1, wherein the laser energy induces selective bond breaking at an interface of a host material of the substrate and the material of the cleave layer, to effect the laser-induced cleaving of the substrate substantially along interface.

3. A system comprising:
   at least one item selected from a list of: an electronic package, PCB, socket bus portion, input device, output device, power supply arrangement and case; and
   at least one silicon-on-insulator semiconductor device manufactured through use of at least the method of claim 2.

4. A method as claimed in claim 1, comprising predetermined balancing of a stoichiometric composition of the material of the cleave layer versus a predetermined laser energy to effect a predetermined cleave yield.

5. A system comprising:
   at least one item selected from a list of: an electronic package, PCB, socket bus portion, input device, output device, power supply arrangement and case; and
   at least one silicon-on-insulator semiconductor device manufactured through use of at least the method of claim 4.

6. A method as claimed in claim 1, comprising:
   bonding the substrate to a receiving substrate prior to the laser-induced cleaving, wherein upon the laser-induced cleaving, a layer cleaved from the substrate remains bonded to the receiving substrate.

7. A system comprising:
   at least one item selected from a list of: an electronic package, PCB, socket bus portion, input device, output device, power supply arrangement and case; and
   at least one silicon-on-insulator semiconductor device manufactured through use of at least the method of claim 6.

8. A method as claimed in claim 1, comprising:
   impinging the laser energy on at least one side edge of the substrate in a side-cut mode in effecting the laser-induced cleaving.

9. A method as claimed in claim 8, wherein the laser energy induces selective bond breaking at an interface of a host material of the substrate and the material, to effect the laser-induced cleaving of the substrate, substantially along the interface.

10. A system comprising:
    at least one item selected from a list of: an electronic package, PCB, socket, bus portion, input device, output device, power supply arrangement and case; and
    at least one silicon-on-insulator semiconductor device manufactured through use of at least the method of claim 9.

11. A method as claimed in claim 8, comprising predetermined balancing of a stoichiometric composition of the material versus a predetermined laser energy to effect a predetermined cleave yield.

12. A system comprising:
    at least one item selected from a list of: an electronic package, PCB, socket bus portion, input device, output device, power supply arrangement and case; and
    at least one silicon-on-insulator semiconductor device manufactured through use of at least the method of claim 11.

13. A method as claimed in claim 8, comprising:
    forming micro-voids in the substrate prior to impinging the laser energy on the at least one side edge of the substrate in the side-cut mode, and effecting the laser-induced cleaving along cleave plane defined by ones of the micro-voids.

14. A method as claimed in claim 13, wherein the substrate comprises silicon (Si), wherein the micro-voids are formed by implantation of at least one of hydrogen (H), H2 and helium (He) into the substrate, and subsequent annealing of the substrate.

15. A system comprising:
    at least one item selected from a list of: an electronic package, PCB, socket bus portion, input device, output device, power supply arrangement and case; and
    at least one silicon-on-insulator semiconductor device manufactured through use of at least the method of claim 14.

16. A system comprising:
    at least one item selected from a list of: an electronic package, PCB, socket bus portion, input device, output device, power supply arrangement and case; and
    at least one silicon-on-insulator semiconductor device manufactured through use of at least the method of claim 13.

17. A method as claimed in claim 8, comprising:
    bonding the substrate to a receiving substrate prior to the laser-induced cleaving, wherein upon the laser-induced cleaving, a layer cleaved from the substrate remains bonded to the receiving substrate.

18. A system comprising:
    at least one item selected from a list of: an electronic package, PCB, socket bus portion, input device, output device, power supply arrangement and case; and
    at least one silicon-on-insulator semiconductor device manufactured through use of at least the method of claim 17.

19. A system comprising:
    at least one item selected from a list of: an electronic package, PCB, socket bus portion, input device, output device, power supply arrangement and case; and
    at least one silicon-on-insulator semiconductor device manufactured through use of at least the method of claim 8.

20. A system comprising:
at least one item selected from a list of: an electronic package, PCB, socket, bus portion, input device, output device, power supply arrangement and case; and
at least one silicon-on-insulator semiconductor device manufactured through use of at least the method of claim 1.

21. A method comprising:
simultaneously applying a plurality of interfering laser beams to a substrate induce cleaving of the substrate substantially along a laser-defined cleave plane; and
designing a profile of a laser energy interference pattern along a thickness of the substrate to determine a depth of a desired cleave plane relative to a surface of the substrate.

22. A method as claimed in claim 21,
wherein the plurality of interfering laser beams have at least one of specifically tuned energies, incidence angles, and space profiles, to define a desired cleave plane.

23. A system comprising:
at least one item selected from a list of: an electronic package, PCB, socket bus portion, input device, output device, power supply arrangement and case; and
at least one silicon-on-insulator semiconductor device manufactured through use of at least the method of claim 22.

24. A method as claimed in claim 21, comprising:
effecting a predetermined material within the substrate to form a predetermined cleave layer, within which the laser-induced cleaving is to be effected.

25. A system comprising:
at least one item selected from a list of: an electronic package, PCB, socket bus portion, input device, output device, power supply arrangement and case; and
at least one silicon-on-insulator semiconductor device manufactured through use of at least the method of claim 24.

26. A method as claimed in claim 24, wherein the substrate comprises silicon (Si), the predetermined material comprises germanium (Ge), and the laser energy is tuned to be greater than a band gap of SiGe but smaller than that of Si.

27. A system comprising:
at least one item selected from a list of: an electronic package, PCB, socket bus portion, input device, output device, power supply arrangement and case; and
at least one silicon-on-insulator semiconductor device manufactured through use of at least the method of claim 26.

28. A method as claimed in claim 24, wherein the substrate comprises silicon (Si), the predetermined material comprises hydrogen (H), and the laser energy is infrared laser energy.

29. A system comprising:
at least one item selected from a list of: an electronic package, PCB, socket bus portion, input device, output device, power supply arrangement and case; and
at least one silicon-on-insulator semiconductor device manufactured through use of at least the method of claim 28.

30. A method as claimed in claim 24, wherein the laser energy induces selective bond breaking at an interface of a host material of the substrate and the predetermined material, to effect the laser-induced cleaving of the substrate substantially along the interface.

31. A system comprising:
at least one item selected from a list of: an electronic package, PCB, socket bus portion, input device, output device, power supply arrangement and case; and
at least one silicon-on-insulator semiconductor device manufactured through use of at least the method of claim 30.

32. A method as claimed in claim 24, comprising at least one of:
stoichiometrically designing a composition of the material to substantially match a bond breaking energy involving the material, to the laser energy; and
selecting the laser wavelength to provide the laser energy to substantially match a bond-breaking threshold energy of the material, based upon at least a stoichiometric composition of the material.

33. A method as claimed in claim 32, comprising predetermined balancing of a stoichimetric composition of the material of the cleave layer versus a predetermined laser energy to effect a predetermined cleave yield.

34. A system comprising:
at least one item selected from a list of: an electronic package, PCB, socket bus portion, input device, output device, power supply arrangement and case; and
at least one silicon-on-insulator semiconductor device manufactured through use of at least the method of claim 33.

35. A system comprising:
at least one item selected from a list of: an electronic package, PCB, socket bus portion, input device, output device, power supply arrangement and case; and
at least one silicon-on-insulator semiconductor device manufactured through use of at least the method of claim 32.

36. A method as claimed in claim 21, comprising:
bonding the substrate to a receiving substrate prior to the laser-induced cleaving, wherein upon the laser-induced cleaving, a layer cleaved from the substrate remains bonded to the receiving substrate.

37. A system comprising:
at least one item selected from a list of: an electronic package, PCB, socket bus portion, input device, output device, power supply arrangement and case; and
at least one silicon-on-insulator semiconductor device manufactured through use of at least the method of claim 36.

38. A system comprising:
at least one item selected from a list of: an electronic package, PCB, socket bus portion, input device, output device, power supply arrangement and case; and
at least one silicon-on-insulator semiconductor device manufactured through use of at least the method of claim 21.

* * * * *